US 6,648,977 B2

(12) United States Patent
Goela et al.

(10) Patent No.: US 6,648,977 B2
(45) Date of Patent: Nov. 18, 2003

(54) METHOD OF PRODUCING NEAR-NET SHAPE FREE STANDING ARTICLES BY CHEMICAL VAPOR DEPOSITION

(75) Inventors: Jitendra Singh Goela, Andover, MA (US); Zlatko Salihbegovic, New Iberia, LA (US); Michael A. Pickering, Dracut, MA (US); Mitch Boudreaux, New Iberia, LA (US)

(73) Assignee: Shipley Company, L.L.C., Marlborough, MA (US)

( * ) Notice: Subject to any disclaimer, the term of this patent is extended or adjusted under 35 U.S.C. 154(b) by 87 days.

(21) Appl. No.: 09/907,374

(22) Filed: Jul. 17, 2001

(65) Prior Publication Data

US 2001/0048171 A1 Dec. 6, 2001

Related U.S. Application Data

(62) Division of application No. 09/226,534, filed on Jan. 6, 1999.

(51) Int. Cl.[7] .......................... H01L 21/00; C23C 16/00
(52) U.S. Cl. ..................... 118/728; 118/715; 118/500; 427/248.1
(58) Field of Search ................... 118/715–730, 500; 156/345.51; 427/248.1

(56) References Cited

U.S. PATENT DOCUMENTS

| 3,781,152 | A | | 12/1973 | Keller et al. | |
|---|---|---|---|---|---|
| 3,899,557 | A | | 8/1975 | Dietze | |
| 3,943,218 | A | | 3/1976 | Dietze et al. | |
| 4,958,592 | A | * | 9/1990 | Anthony et al. | ............ 118/724 |
| 4,963,393 | A | | 10/1990 | Goela et al. | |
| 4,990,374 | A | | 2/1991 | Keeley et al. | |
| 4,997,678 | A | | 3/1991 | Taylor et al. | |
| 5,007,374 | A | * | 4/1991 | Yamazaki et al. | ....... 118/723 E |
| 5,071,596 | A | | 12/1991 | Goela et al. | |
| 5,217,755 | A | * | 6/1993 | Thebault et al. | ......... 427/249.2 |
| 5,232,507 | A | * | 8/1993 | Ohtoshi et al. | ............. 118/719 |
| 5,354,580 | A | * | 10/1994 | Goela et al. | ............. 427/248.1 |
| 5,366,764 | A | | 11/1994 | Sunthankar | |
| 5,374,412 | A | | 12/1994 | Pickering et al. | |
| 5,478,608 | A | * | 12/1995 | Gorokhovsky | ............... 427/571 |
| 5,683,028 | A | | 11/1997 | Goela et al. | |
| 5,683,507 | A | | 11/1997 | Barrett et al. | |
| 5,840,124 | A | | 11/1998 | Gurary et al. | |
| 5,855,678 | A | * | 1/1999 | Sanjurjo et al. | ............. 118/715 |
| 6,133,121 | A | * | 10/2000 | Tsunashima et al. | ......... 438/478 |
| 6,231,923 | B1 | * | 5/2001 | Teverovsky et al. | ..... 427/248.1 |

FOREIGN PATENT DOCUMENTS

| GB | | 792589 | | 4/1958 | |
|---|---|---|---|---|---|
| JP | | 02185975 A | * | 7/1990 | ........... C23C/16/44 |
| JP | | 06017251 A | * | 1/1994 | ........... C23C/16/02 |

OTHER PUBLICATIONS

European Patent Office—Patent Abstract of Japan, English patent abstract of Japanese Publication No. 55122204, published Sep. 19, 1980.

(List continued on next page.)

Primary Examiner—Gregory Mills
Assistant Examiner—Ram N Kackar
(74) Attorney, Agent, or Firm—John J. Piskorski (57) ABSTRACT

Near net shape free standing articles can be produced by chemical vapor deposition techniques when a suitable substrate is suspended in a chemical vapor deposition zone according to the disclosed technique. By suspending such substrates from linear suspension supports such as ropes, cables and wires, multiple near net shape articles can be produced with substantial manufacturing cost savings over previously employed techniques.

17 Claims, 5 Drawing Sheets

OTHER PUBLICATIONS

Geril. N. et al., "Thin Shell Replication of Grazing Incident (WolterType I) SiC Mirrors", SPIE Proc., 2478, 215 (1995) (Reprint of article without page numbers).

Goela et al. "Optics applications of Chemical Vapor Deposited B–Sic" in Critical Reviews of Optical Science and Technology, vol. CR67, S. Photo–Optical Instrumentation Eng. Bellingham, Wash., pp. 71–104.

U.S. patent application Ser. No. 09/072,927, filed May 5, 1998 (copy not included—previosly of record with U.S. Patent and Trademark Office).

Near Net Shape Silicon Carbide Deposition System, Announcement of TevTech, L.L.C., 2 pages, date unknown.

* cited by examiner

METHOD OF PRODUCING NEAR-NET SHAPE FREE STANDING ARTICLES BY CHEMICAL VAPOR DEPOSITION

This application is a divisional of copending application (s) application Ser. No. 09/226,534 filed on Jan. 6, 1999.

BACKGROUND OF THE INVENTION

1. Field of the Invention

The production of free-standing articles by chemical vapor deposition (CVD) can provide such articles with enhanced properties. The use of CVD to provide articles in near-net shape (NNS), such that only minimal finishing is required to provide the article in its finished shape, is especially useful for producing articles having critical dimensional tolerances from materials, such as silicon carbide, which are difficult to shape by conventional machine shaping techniques. The present invention provides an improved method of mounting substrates during the CVD process. It is particularly applicable to the production of near-net shape silicon carbide articles.

2. Description of Related Art

The advantages of silicon-carbide as a fabrication material for astronomical X-ray telescopes and the experimental use of small scale CVD processing to prepare conical silicon carbide shells were recently described by Geril et al. in "Thin Shell Replication of Grazing Incident (Wolter Type I) SiC Mirrors", SPIE Proc., 2478, 215 (1995).

Free-standing silicon carbide materials produced by CVD processing in applications requiring a high degree of surface smoothness and polishability are described in U.S. Pat. No. 5,374,412. Apparatus and process conditions used to produce such articles are described in that patent. U.S. Pat. Nos. 4,990,374; 4,997,678 and 5,071,596 further describe CVD processes for producing free-standing silicon carbide materials by the pyrolytic deposit of SiC on a mandrel.

Typically, CVD derived articles are produced by CVD deposit of the desired material on a substrate, followed by separation of the article from the substrate. One prior method produces a relatively large sheet of monolithic SiC on a flat graphite mandrel coated with a thin layer of a release coating. Pyrolysis of methyltrichlorosilane in argon and excess hydrogen produced a deposit which, after separation from the mandrel, was cut into multiple susceptor rings for use supporting wafers in semiconductor processing furnaces. While this method produces satisfactory parts, they are not produced in near-net shape and require substantial machining. The production of the deposit in near-net shape is desirable to reduce the amount of waste material generated and reduce the amount of machining required.

Several methods of controlling or isolating the deposit of silicon carbide to one intended side of the substrate during chemical vapor deposition are described in U.S. Pat. Nos. 4,963,393 and 4,990,374. In U.S. Pat. No. 4,963,393, a curtain of flexible graphite cloth is arranged to shield the backside of the substrate from the flowing reacted precursor gases, whereby silicon carbide deposits on the backside of the substrate are avoided. In U.S. Pat. No. 4,990,374 a counterflow of a non-reactive gas flows from behind the substrate past the substrate's peripheral edge whereby the reactive deposition gases and the deposit they produce are confined to the front face of the substrate.

Another prior technique controls the deposition by providing a channel surrounding that portion or zone of the substrate surface where the deposit is desired. The channel functions to restrict flow of the reactive deposition gases to the substrate surfaces surrounding the deposition zone whereby any deposit on the surrounding surfaces is substantially thinner than the deposit formed in the deposition zone.

Still another previous method provided multiple shaped graphite ring mandrels (substrates) mounted along the extent of the deposition chamber by detachable graphite mounts gripping the edge of the rings. Silicon carbide was deposited on both sides of the mandrels, the mandrels removed from the deposition chamber and the edges of the deposits on the mandrels machined to release the bottom and top deposits as two separate silicon carbide articles. This process resulted in relatively heavy deposits of silicon carbide bridging the graphite mandrel and the graphite mounts, necessitating difficult machining in the vicinity of the areas occupied by the mounts, and often resulted in cracks developing in the deposits during separation of the mount from the mandrel. These cracks often propagated through the desired product causing it to be rejected. If sufficient mounts are not used, the increased weight of the deposit on the mandrels sometimes caused the mandrels to slip from the mounts damaging the deposits and adjacent mandrels.

SUMMARY OF THE INVENTION

Chemical vapor deposition (CVD) has been used to produce both free-standing articles and coatings of various materials, such as, silicon carbide. Typically, such a process involves reacting vaporized or gaseous chemical precursors in the vicinity of a substrate to result in silicon carbide depositing on the substrate. The deposition reaction is continued until the deposit reaches the desired thickness. If a coated article is desired, the substrate is the article to be coated and the coating is relatively thin, generally less than 100 microns (0.1 mm) thick. If a free-standing article or silicon carbide bulk material is desired, a thicker deposit, generally greater than 0.1 mm thick, is formed as a shell on the substrate and then separated from the substrate to provide the silicon carbide article.

In a typical silicon carbide bulk material production run, silicon carbide precursor gases or vapors are fed to a deposition chamber where they are heated to a temperature at which they react producing silicon carbide. The silicon carbide deposits as a shell on a solid substrate. The deposition is continued until the desired thickness of silicon carbide is deposited. The substrate is then removed from the deposition chamber and the shell separated therefrom. Monolithic silicon carbide plates and cylinders have been produced by applying such chemical vapor deposition (CVD) techniques on suitably shaped substrates. Some articles require a deposit about one inch thick, which can require deposition processing extending three hundred hours or longer.

Once the silicon carbide precursor gases or vapors are brought to the appropriate conditions to cause them to react, they produce silicon carbide which deposits on any available surface. Such deposit generally is not limited to the intended surface of the substrate and generally extends past such surface to adjoining surfaces as well as depositing on the walls, housing and any other available surfaces associated with the deposition chamber. In prior processes, the silicon carbide deposit has extended past the dimensional limits of the substrate covering adjacent portions of the support structure holding or clamping the mandrel/substrate in position in the deposition chamber. These extraneous deposits not only consume the deposition chemicals, they can be relatively thick requiring either their removal from the production equipment or that the equipment be routinely replaced. The consumption of deposition chemicals and refurbishing or replacement of furnace equipment add considerable expense to the cost of the process. Moreover, it is generally necessary to fracture the deposits to remove the substrate from their mount in the deposition chamber. Fracturing of the relatively thick deposit often results in the formation of cracks which propagate through the deposit. Such cracks are not acceptable in most of the intended applications of the silicon carbide articles, and result in the article being rejected. The prevalence of propagated cracks in relatively thick chemical vapor deposits of silicon carbide have limited the size of articles which can be produced commercially by this method. Moreover, recognition of the potential capacity of CVD silicon carbide deposits to bridge joints between adjacent stacked substrates and the subsequent difficulty of separating and removing individual substrates from such a stack has precluded the use of stacked multiple substrates in the commercial production of silicon carbide articles.

Some previous techniques have sought to reduce the above noted extraneous deposits by controlling the flow of the reactive deposition gases so that they contact and form the intended deposit on only one side of the substrate. If the thermal properties of the substrate used in such processes are not perfectly matched with those of the deposit, stresses are introduced during the cool-down from the deposition temperature which cause distortion of the deposit, and, in extreme cases;-can cause cracks to develop in the deposit. Moreover, these limitations restrict the amount of material which can be produced in a given size deposition chamber.

The present invention is directed to a process, and associated apparatus, for producing bulk materials by chemical vapor deposition wherein extraneous deposits (i.e. deposits formed on deposition chamber surfaces other than the intended production surface of the substrate) are minimized. Reduction of such extraneous deposits provides economic benefits both with respect to the cost of raw materials and the labor costs associated with CVD processing. The present invention further provides a relatively inexpensive method of mounting the substrate in the deposition chamber whereby the substrate can be readily separated from the mounting structure without causing cracks to propagate through the deposited bulk material. A further advantage of the inventive process is the use of devices to mount the substrate which are sufficiently inexpensive to be disposable, whereby the removal of extraneous material deposited thereon is not necessary. The inventive process can be used to produce articles of silicon carbide or of any of the materials which are capable of being produced by CVD processing, such as zinc sulfide, zinc selenide, boron nitride, boron carbide, silicon nitride, titanium diboride and aluminum nitride.

According to the present process, suitably shaped substrates, or mandrels, are suspended and solely supported in the deposition chamber by linear suspension supports, preferably flexible linear suspension supports, such as ropes or cables, which engage the substrate(s) at their edge(s) and extend to supporting structure on, or in, the deposition chamber housing. The suspension supports are referred to as linear because they have a longitudinal dimension which is much greater than their transverse dimension which is located adjacent the substrate. The linear suspension supports and the substrates are designed to enable minimal contact between the surface of the substrate and any other apparatus in the deposition zone, while providing adequate support to assure that the substrate does not break loose as it gains weight during the deposition process. While some deposition occurs on the linear suspension supports during the process, the minimal contact of the support with the substrate provides a degree of flexibility which enables the separation of the support from the coated substrate without causing cracks to propagate throughout the deposit. Moreover, any deposits formed on the preferred rope or cable linear supports can often be removed by merely flexing the rope or cable. Should the linear suspension supports become unduly coated or contaminated in some other manner, they are relatively inexpensive to replace, and therefore do not require extensive cleaning or decontamination procedures to enable them to be reused.

DETAILED DESCRIPTION OF THE INVENTION

Figure 1:
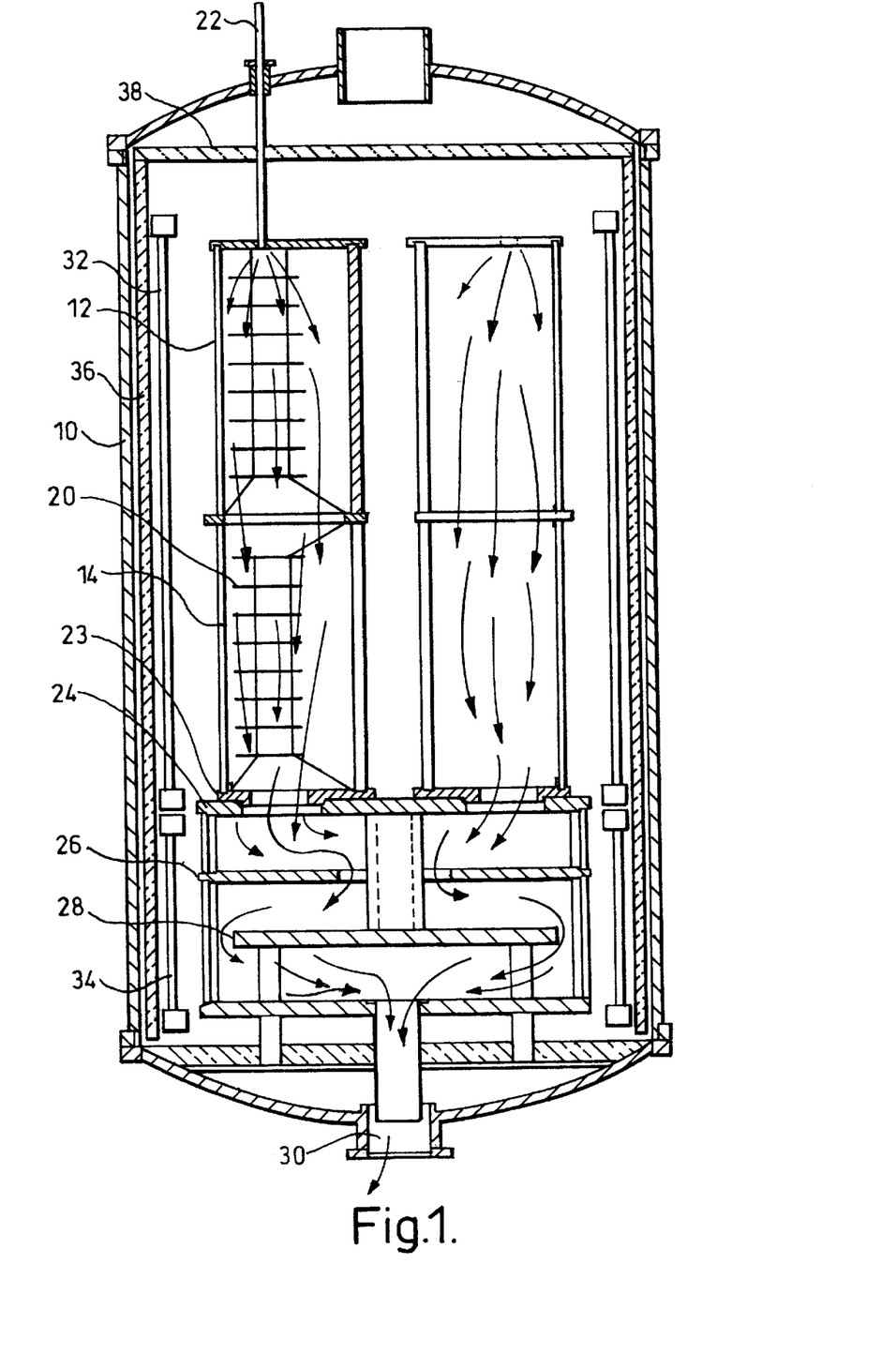
FIG. 1 is a schematic cross-section of a CVD furnace in which the present invention is practiced.

A preferred CVD furnace for practicing the present invention is illustrated in FIG. 1. The furnace 10 encloses multiple deposition boxes 12, 14, 16 and 18. As most fully illustrated in deposition boxes 12 and 14, multiple flat ring-like mandrels, or substrates, 20, are deployed along the length of the box. Precursor reactive gases are fed to the upper box 12 through injector 22. The precursor reactive gases circulate around and through the substrates, eventually passing to lower deposition box 14 where they similarly circulate about the substrates deployed in that box. The gases eventually pass from deposition box 14 through end plate 23, exhaust plate 24, pass through the flow diversion plate 26, around baffle plate 28 and eventually are discharged from the furnace through exhaust port 30. Heating elements 32, 34 for controlling the deposition temperature are provided outside of the deposition boxes. Insulation 36, 38 is provided between the furnace wall and the heating elements. Substrates and an injector may be deployed with deposition boxes 16 and 18 in the same manner as shown with deposition boxes 12 and 14, or, alternatively, different substrates may be deployed and supported in a different manner in boxes 16 and 18.

Figure 2:
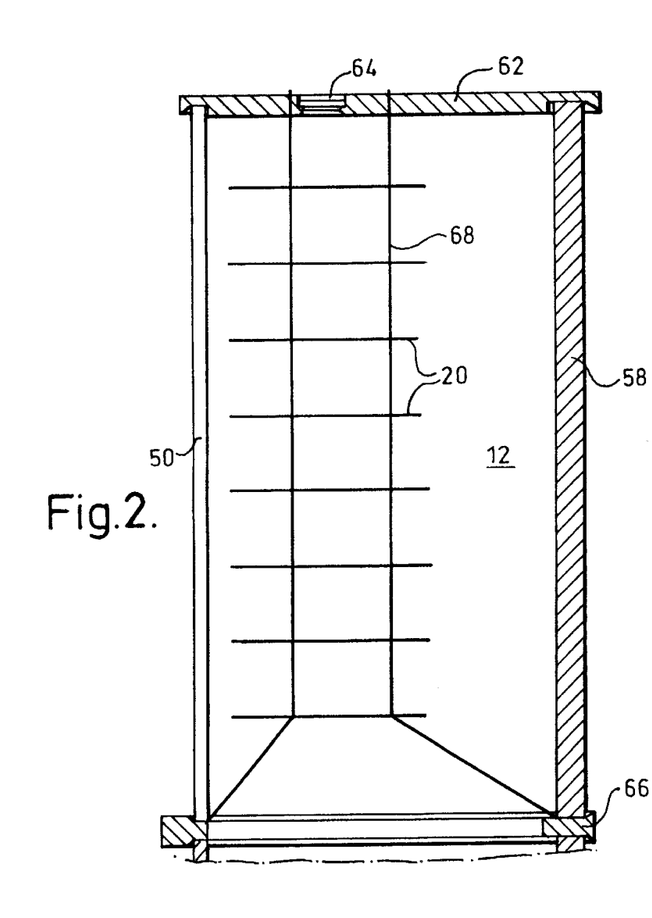
FIG. 2 is a cross-section of one of the deposition boxes illustrated in the furnace of FIG. 1.
Figure 3:
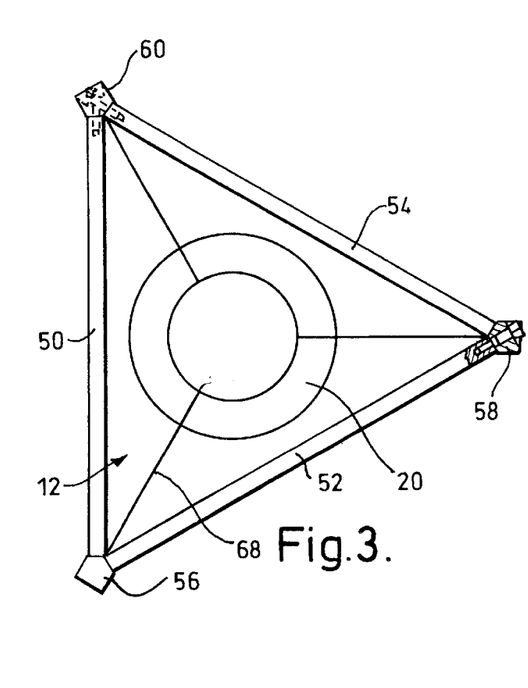
FIG. 3 is a top view of a cross-section of the deposition box illustrated in FIG. 2.

Deposition box 12 is further illustrated in FIGS. 2 and 3. The three walls 50, 52 and 54, of the box are connected through three corner posts 56, 58 and 60. Cover plate 62 contains port 64 which cooperates with injector 22 to essentially preclude the reactive gases migrating into the remainder of the furnace from the deposition box. A mating ring 66 provides a conforming mating relationship between upper deposition box 12 and lower deposition box 14. Three linear suspension supports 68 extend from anchoring means associated with the cover plate 62, through an engagement with each of the eight ring-like substrates 20, to further anchoring means associated with mating ring 66. The linear suspension supports 68 provided in the lower deposition box 14 (FIG. 1) are attached to anchoring supports associated with the mating ring 66 and end plate 23.

The linear suspension supports 68 are designated to be linear because their dimension which is spanned by contact with the substrate, usually their diameter, is minor in relation to their longitudinal dimension, or length. Preferably, the linear suspension supports are sufficiently manually flexible to be coilable. Such preferred supports can be selected from rope, cable or wires. The supports need to be made of materials which will withstand the temperatures and chemicals encountered during the deposition process. Representative suitable materials include graphite, sapphire, tungsten, molybdenum and quartz. We have found braided graphite rope to form particularly suitable linear suspension supports for the production of CVD silicon carbide articles in a deposition box arrangement similar to that shown in FIGS. 1–3.

The anchoring means for securing the linear suspension supports can be any means capable of holding, or anchoring, the ends of such supports in place throughout the deposition process. Suitable anchoring means provided on the cover plate, walls or posts of the deposition box include hooks, eyebolts, cleats, via holes, or specialized mating means which cooperate with specialized mating means at the ends of the suspension supports.

The linear suspension supports engage the substrates in a supporting relationship. Preferably, the engagement does not result in a rigid fixed joinder between the supports and the substrates such as would be provided by a locking clamp, but instead permits a limited degree of movement between the support and the substrate. Engaging the linear suspension supports in slots or holes provided at the periphery of the substrates and fixing an interfering structure projecting from the supports beneath the slot or hole are preferred forms of supporting the substrates when they are deployed in a generally horizontal configuration, as in FIGS. 1–3. The interfering structure can be a knot tied in a rope or cable support, or it could be a pin or screw laterally attached to a rope, wire or cable support or it could be the residue of a hardened cement.

Figure 4:
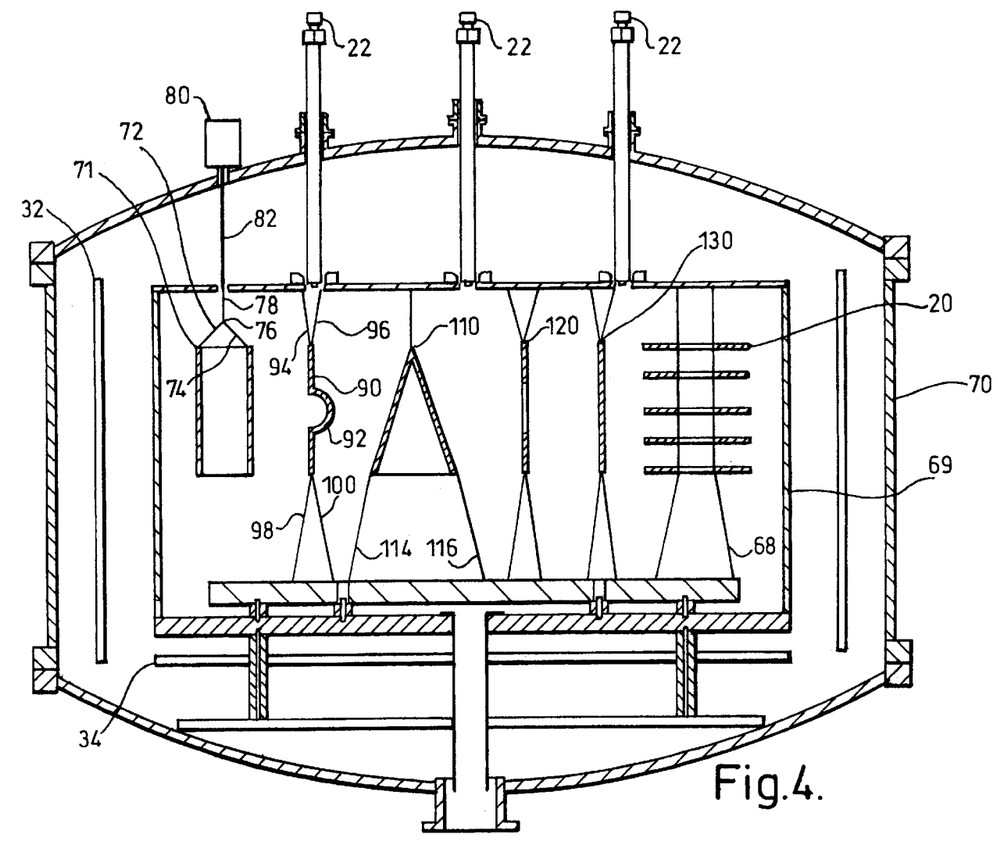
FIG. 4 is a schematic cross-section of a further CVD furnace in which several embodiments of the present invention are being practiced.

FIG. 4 is a schematic of several different shaped substrates supported in a single deposition box 69 in a furnace 70 of a CVD system by linear suspension supports in accord with the present invention. The substrates, also referred to as mandrels, are typically fabricated from relatively thin material with one, two, or multiple sides, having a figure, or shape, which is a negative of the actual article to be produced. The substrates can be fabricated from materials such as graphite, silicon, sapphire, quartz, molybdenum, titanium or tantalum. In FIG. 4, the same item numbers are used to designate components similar to those of the FIGS. 1–3 embodiment. Substrate 71 is a hollow shape, such as a cylindrical tube or box channel, which engages two or more linear suspension supports 72, 74 at its upper periphery. The two or more linear suspension supports 72, 74 are joined at 76 to form a further support 78 which extends upwardly to functional attachment to a rotation means, such as motor 80. The further support 78 is shielded by an insulated housing 82 extending from the roof of the furnace 70 to the deposition box 69. Rotation of the substrate throughout the deposition process can, in some cases, provide a more uniform deposition.

Substrate 90 is a plate containing a dome shaped portion 92. This substrate is supported by two linear suspension supports 94, 96 descending from the top of the deposition box 69, and two similar linear supports 98, 100 extending up from the floor of the deposition box.

Substrate 110 is for the production of cone-shaped articles. It is suspended by a single linear suspension support 112 anchored to the roof of the deposition box and two linear supports 114, 116 anchored to the floor of the box.

Substrate 120 is a ring-shaped plate, or disc, similar to the substrates 20 used in the FIG. 1 embodiment. Substrate 130 is a flat plate. Both substrates 120 and 130 are suspended vertically in similar manner by two linear suspension supports anchored to the roof of the deposition box and engaging the periphery of the substrates. Two linear supports, which are anchored to the floor of the deposition box, also engage the periphery of each of the substrates. The horizontally suspended series of ring-shaped substrates 20 and linear suspension supports 68 shown in FIG. 4 are similar to the like-numbered substrates and supports in the FIG. 1 embodiment.

Susceptor rings for supporting wafers in semiconductor furnaces have been produced of CVD silicon carbide in a furnace similar to the embodiment of FIGS. 1–3. Eight 0.1 inch thick graphite ring mandrels 20 having an outside diameter of 9.75 inches and an inside diameter of 6.25 inches were suspended in a deposition box 12 on three graphite rope linear suspension supports 68. Three holes were drilled in each ring near the periphery of its inner diameter. Four of the rings were coated with an amorphous carbon release layer. The graphite ropes were inserted in the holes and knots were tied in the rope to support and fix the location of each ring. The graphite ropes were tied to the top and bottom covers of the triangular deposition box to horizontally suspend the rings four inches apart.

A precursor gas mixture of methyltrichlorosilane in excess hydrogen and argon was fed to the top of the deposition box and silicon carbide was deposited for approximately 75 hours at a temperature of 1350° C. and a pressure of 200 torr. The flow rate of methyltrichlorosilane varied between 9 and 12 standard liters per minute (slpm), the flow rate of $H_2$ was 67 slpm and that of Ar was 69 slpm. The silicon carbide deposited on both sides of the rings to thicknesses in the range of 0.11 to 0.25 inches with no apparent visible cracks or chipping of the deposits on the rings. The graphite rope suspension supports were released from the top and bottom covers of the box, and removed, with the rings, from the box. The deposits of silicon carbide on the ropes were of uneven thickness. Twisting and slight shaking of the ropes near their engagement with the rings permitted the ropes to be removed from the rings without difficulty. Slight flexure of the ropes caused the deposit on the ropes to fracture and break loose. Processing caused brittleness to develop in the graphite ropes themselves and such slight flexure also caused the ropes to fall apart. All eight rings were recovered in good shape without excessive silicon carbide growth near the holes which contained the ropes and without any cracks developing through the silicon carbide deposits. The outside edge of the deposit was then machined to expose the graphite mandrel. The deposits on the substrates which had been treated with an amorphous carbon release layer readily separated from the substrate. With the substrates that did not receive a release layer, the graphite was removed by burning in air at 700° C. Separation of the substrate from the deposits on each side thereof resulted in the production of two silicon carbide rings for each graphite mandrel. The resulting silicon carbide rings were then machined to the dimensions required of susceptor rings used in semiconductor furnaces.

While graphite mandrels can be removed by burning, different substrate materials may be removed by machining or by chemical treatment with a suitable etchant or solvent. Such etchants or solvents should be functional to remove the substrate material while having negligible affect on the deposit.

Figure 5:
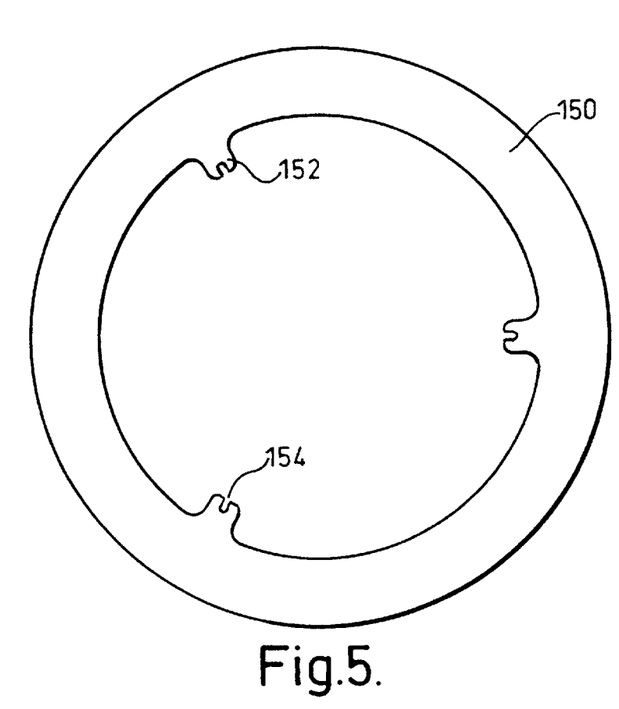
FIG. 5 is a top view of a substrate particularly adapted for use in the present invention.
Figure 6:
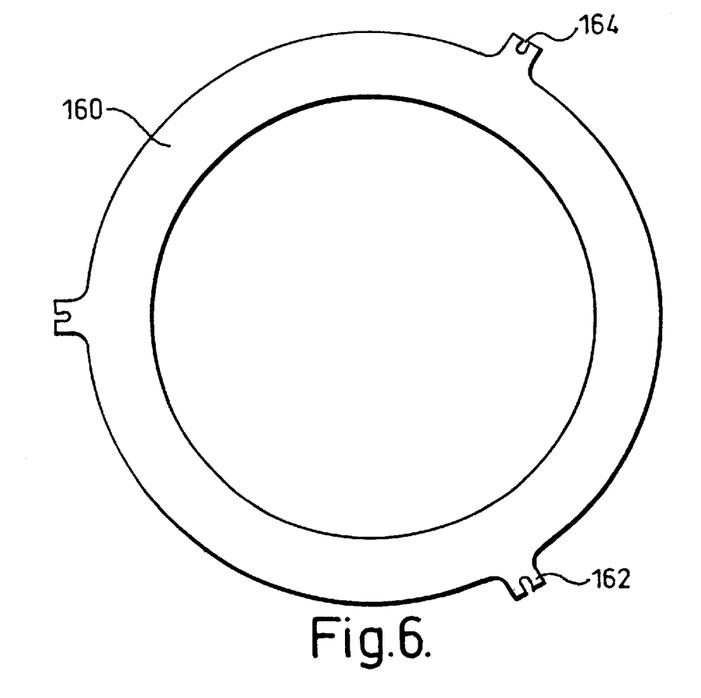
FIG. 6 is a top view of a further substrate particularly adapted for use in the present invention.

Machining is required to remove the hole provided to engage the linear suspension supports 68 of the mandrel 20 in the embodiment of FIGS. 1–3. Such machining can result in considerable waste of the deposited material, as well as increased production costs. Improved substrates for use in the inventive technique, which reduce the final machining required to provide the intended article, are illustrated in FIGS. 5 and 6. The mandrel 150 of FIG. 5 is essentially ring-shaped, however protrusions, or tabs 152, which extend from the inner nominal diameter of the ring toward its center, are spaced about the ring's inner periphery. A tab is provided for each of the linear suspension supports used to suspend the mandrel in the deposition zone. An engagement means, such as slot 154, capable of engaging the linear suspension support, is provided on each of the tabs. The mandrels are attached to the linear suspension supports by the engagement means during the deposition. Upon completion of the deposition, less machining is required to remove the tabs and form the article in its final shape than is required with the FIGS. 1–3 mandrels.

The mandrel 160 of FIG. 6 is generally ring-shaped with protrusions, or tabs 162, extending outwardly from its outer nominal diameter/periphery. Each tab contains an engagement means, such as slot 164, for engagement with a linear suspension support. As with mandrel 150 (FIG. 5), less machining is required to remove the tabs 162 and finish the article to its final shape than is required with the mandrel 20 (FIGS. 1–3).

Protrusions, or tabs, containing engagement means can be provided on mandrels of various shapes. For instance, they can be provided on the edges of flat plate substrates, such as substrate 130 (FIG. 4), or on the side of three dimensional shaped substrates, such as substrate 90 (FIG. 4). Preferably, depending on the substrate's weight, shape and size, one to four tabs are provided on each substrate. Usually the tabs are removed following the deposition to expose the underlying substrate and to form the article in its final shape.

Figure 7:
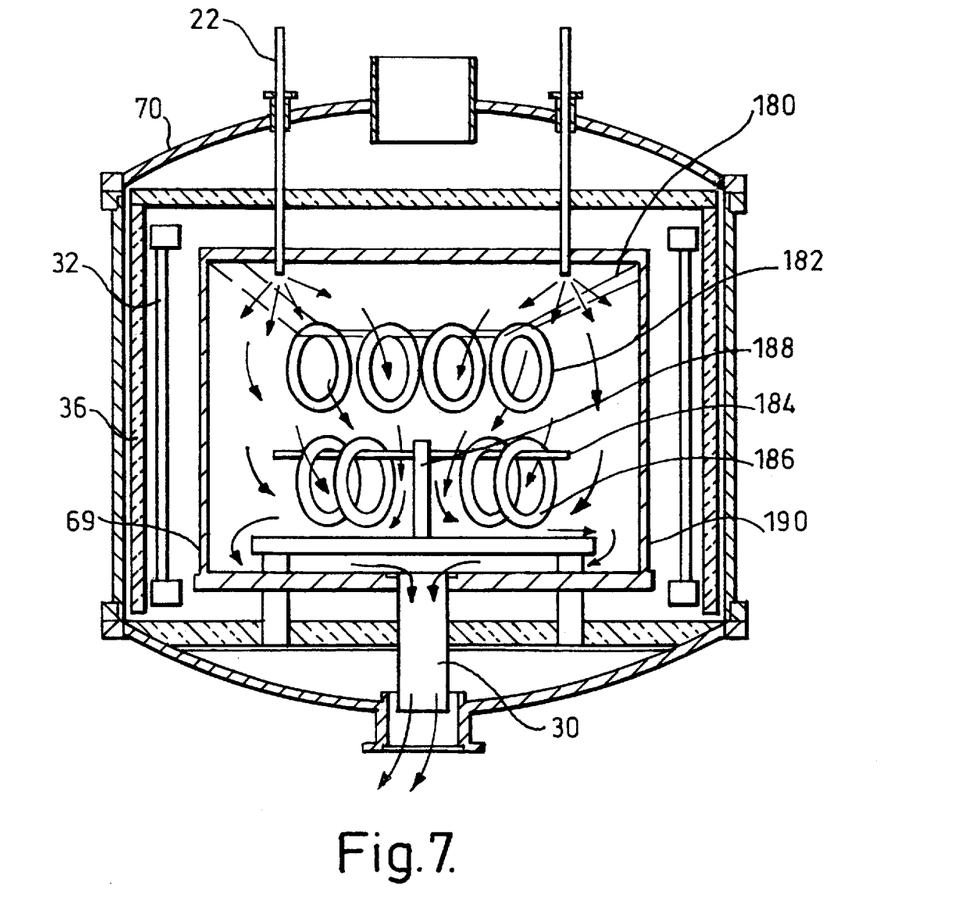
FIG. 7 is a schematic cross-section of a further CVD furnace in which several further embodiments of the present invention are being practiced.

The linear suspension supports of the preceding embodiments are provided in a generally vertical arrangement. Linear suspension supports can also be provided in a generally horizontal arrangement. FIG. 7 illustrates the use of two generally horizontal arrangements of linear suspension supports according to the present invention. The same item numbers are used to designate components which are similar to those of previous embodiments. Each of two flexible linear suspension supports, such as graphite ropes 180, are attached at opposite sides of the deposition box 69. The flexible linear suspension supports 180 extend generally horizontally across the chamber and engage a line of four ring-like mandrels 182 through holes provided in the mandrels to vertically suspend the mandrels in the furnace. A further linear suspension support 184 suspends another line of four ring-like mandrels 186. The linear suspension support 184 is formed from relatively rigid material such as bars, pipes or rods of graphite, molybdenum, tungsten, etc. The rigid linear suspension support 184 can be mounted to extend out from both sides of a central post 188, as shown. Alternatively, it can be mounted on two or more posts or it can extend between mounting brackets affixed to opposite side walls 190 of the deposition box.

One or multiple linear suspension supports 180, 184 may be provided to support each line of substrates. The substrates' means for engaging the linear suspension supports may be provided on projections, or tabs. As demonstrated with the line of mandrels 184, those substrates which have an interior void, such as the ring-like mandrels 186, can be suspended in the deposition zone, without the need for additional engagement structure, by hanging them on a linear suspension support extending through the void.

Vertical suspension of relatively large flat plates, i.e. plates with a greater than 15 inch cross-dimension, provides a more uniform deposit on both sides of the plate than does horizontal suspension of such plates. With smaller parts, horizontal suspension provides a more uniform deposit on each side of the substrate, however, the average thickness may differ considerably between the two sides.

Accordingly, the described technique of suspending relatively thin substrates in a CVD furnace enables the production of near-net shape, crack-free, CVD free-standing articles in high yield. Moreover, it accomplishes such with substantial reduction in manufacturing costs over the previously used substrate mounting techniques. These reduced manufacturing costs result from:

lower-cost, even disposable, mounting structure;
increased substrate capacity per production run;
increased output per substrate due to production deposits provided on both sides of substrate;
reduced finishing/machining costs; and
reduced reagent costs due to reduced waste material.

The foregoing is provided to enable workers to practice the invention and to describe what is currently believed to be the best mode of practicing the invention. The scope of the invention is defined by the following claims.

We claim:

1. An apparatus for chemical vapor deposition comprising: a deposition box having multiple sides, a cover plate with at least one port for the ingress of reactants and an end plate with a port for the egress of the reactants, the deposition box comprises at least one linear suspension means for suspending a substrate in the box, the at least one linear suspension means has a first end associated with an at least one anchoring means of the box, a second end for engaging a substrate at an at least one engaging means on the substrate, the engaging means of the substrate comprises a hole or a slot, the at least one linear suspension means is sufficiently flexible such that the at least one linear suspension means may be twisted or flexed to release the substrate with a deposit.

2. The apparatus of claim 1, wherein the deposition box comprises a first pair of linear suspending means anchored at their first ends to respective anchoring means associated with the end plate and their second ends engaged with a first engaging means of the substrate, and a second pair of linear suspending means anchored at their first ends with respective anchoring means at the cover plate and the second ends of the second pair of linear suspending means are engaged at a second engaging means of the substrate to suspend the substrate.

3. The apparatus of claim 1, wherein the linear suspension means is a rope comprising graphite, sapphire, tungsten, molybdenum or quartz.

4. The apparatus of claim 1, wherein the anchoring means comprises a hook, eyebolt, cleat, via holes, or combinations thereof.

5. The apparatus of claim 1, wherein the hole or slot of the engaging means is located in a protrusion continuous with the substrate.

6. The apparatus of claim 1, wherein the substrate comprises a cylindrical tube-shaped mandrel, a dome-shaped mandrel, or a ring-shaped mandrel.

7. The apparatus of claim 6, wherein the ring-shaped mandrel has three protruding engaging means with holes extending from an inner nominal diameter of the ring-shaped mandrel to a center of the ring-shaped mandrel, or extending outwardly from an outer nominal diameter away from the center of the ring shaped mandrel.

8. The apparatus of claim 1, further comprising a furnace having sides that surround the deposition box, a top having at least one injector in fluid connection with the at least one port of the cover plate for the ingress of reactants, and a base that is in fluid connection with the port of the end plate for the egress of reactants.

9. A apparatus for chemical vapor deposition comprising: a deposition box having multiple sides, a cover plate with at least one port for the ingress of reactants, and an end plate with a port for the egress of reactants, at least one linear suspension means having a first end associated with a first anchoring means at one end of the deposition box and a second end associated with a second anchoring means at an opposite end of the deposition box, the linear suspension means suspends a substrate to be coated in the deposition box the substrate has an engaging means comprising holes or slots for the linear suspension means to suspend the substrate in the deposition box, the at least one linear suspension means is sufficiently flexible such that the at least one linear suspension means may be twisted or flexed to release the substrate with a deposit.

10. The apparatus of claim 9, wherein the holes or slots of the engaging means are located on protrusions that are continuous with the substrate.

11. The apparatus of claim 9, wherein the substrate is a ring-shaped mandrel comprising protrusion engaging means extending inwardly from an inner nominal diameter toward a center of the ring-shaped mandrel, or extending outwardly from an outer nominal diameter of the ring-shaped mandrel.

12. The apparatus of claim 9, wherein the anchoring means comprises hooks, eyebolts, cleats, or via holes.

13. The apparatus of claim 9, wherein the first anchoring means is joined to the top cover of the deposition box and the second anchoring means is joined to the end plate of the deposition box.

14. A ring-shaped mandrel having an annular portion that is larger than the thickness of the ring-shaped mandrel comprising at least one protrusion engaging means that is coplanar with a surface of the ring-shaped mandrel and extends outwardly from an outer normal diameter of the mandrel surface away from a center of the mandrel, the protrusion engaging means provides a means for suspending the ring-shaped mandrel in a chemical vapor deposition chamber such that the ring-shaped mandrel does not contact a surface of the chemical vapor deposition chamber.

15. The ring-shaped mandrel of claim 14, wherein the protrusion engaging means is a tab comprising a hole or a slot.

16. The ring shaped mandrel of claim 15, wherein the mandrel comprises 3 tabs.

17. A ring-shaped mandrel having an annular portion that is larger than the thickness of the ring-shaped mandrel comprising at least one protrusion engaging means that is coplanar with a surface of the ring-shaped mandrel and extends from an inner normal diameter of the mandrel surface toward the center of the mandrel, the protrusion engaging means provides a means for suspending the ring-shaped mandrel in a chemical vapor deposition chamber, the protrusion engaging means is a tab comprising a hole or a slot.

* * * * *